(12) United States Patent
Schwartz et al.

(10) Patent No.: US 7,615,141 B2
(45) Date of Patent: Nov. 10, 2009

(54) ELECTROCHEMICAL MICROMANUFACTURING SYSTEM AND METHOD

(75) Inventors: Daniel T. Schwartz, Seattle, WA (US); John D. Whitaker, Seattle, WA (US)

(73) Assignee: University of Washington, Seattle, WA (US)

( * ) Notice: Subject to any disclaimer, the term of this patent is extended or adjusted under 35 U.S.C. 154(b) by 547 days.

(21) Appl. No.: 10/574,552

(22) PCT Filed: Oct. 1, 2004

(86) PCT No.: PCT/US2004/032638

§ 371 (c)(1),
(2), (4) Date: Nov. 30, 2006

(87) PCT Pub. No.: WO2005/033798

PCT Pub. Date: Apr. 14, 2005

(65) Prior Publication Data

US 2007/0089993 A1    Apr. 26, 2007

Related U.S. Application Data

(60) Provisional application No. 60/508,756, filed on Oct. 3, 2003.

(51) Int. Cl.
*C25D 5/02* (2006.01)

(52) U.S. Cl. .................... 205/133; 205/118; 204/224 R

(58) Field of Classification Search ............. 204/224 R, 204/225, 230.2, 290.01; 205/118, 133, 170
See application file for complete search history.

(56) References Cited

U.S. PATENT DOCUMENTS

| | | | | |
|---|---|---|---|---|
| 1,416,929 | A | * | 5/1922 | Bailey ........................ 205/133 |
| 4,023,833 | A | * | 5/1977 | Wellard ...................... 285/179 |
| 5,641,391 | A | | 6/1997 | Hunter et al. |
| 6,027,630 | A | | 2/2000 | Cohen |
| 6,080,288 | A | | 6/2000 | Schwartz et al. |
| 6,390,610 | B1 | | 5/2002 | Hawkins et al. |

* cited by examiner

*Primary Examiner*—Nam X Nguyen
*Assistant Examiner*—Luan V Van
(74) *Attorney, Agent, or Firm*—Christensen O'Connor Johnson Kindness PLLC

(57) ABSTRACT

An electrochemical printing system (100, 200) and method are disclosed having a printer head (130, 230) that expels a small jet of electrolyte (112) towards a conductive substrate (92) to facilitate electrodeposition or removal of material from the substrate. In an embodiment of the invention the printer head includes a plurality of individually addressable electrodes (220), each electrode having a channel therethrough and wherein the electrodes are much larger than the electrolyte jet outlet. The printer head includes means for inhibiting cross talk between electrodes. For example, the printer head may include a plenum (241) and a nonconductive cross-talk inhibition layer (245) upstream of the electrodes. A resolution defining layer (270) having small apertures (271) is provided at the distal end of the printer head.

22 Claims, 8 Drawing Sheets

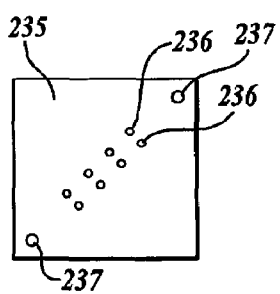 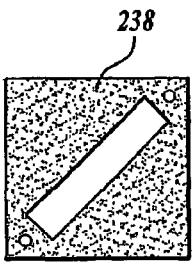 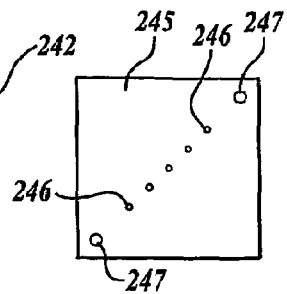
*Fig.3A.*    *Fig.3B.*    *Fig.3C.*    *Fig.3D.*
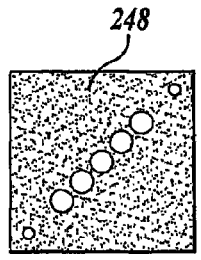 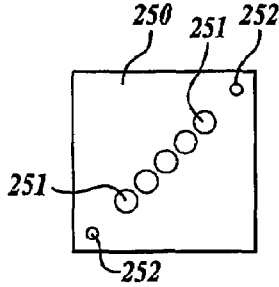 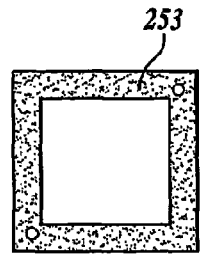 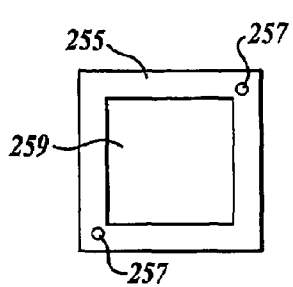
*Fig.3E.*    *Fig.3F.*    *Fig.3G.*    *Fig.3H.*
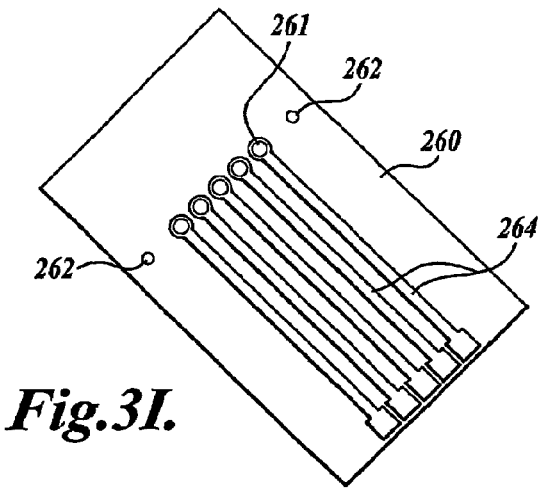
*Fig.3I.*
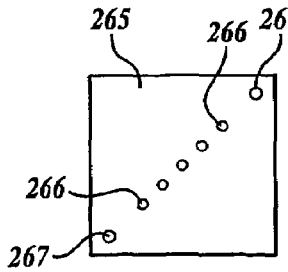 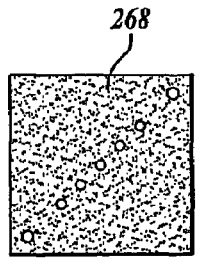 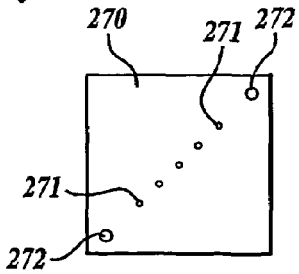
*Fig.3J.*    *Fig.3K.*    *Fig.3L.*

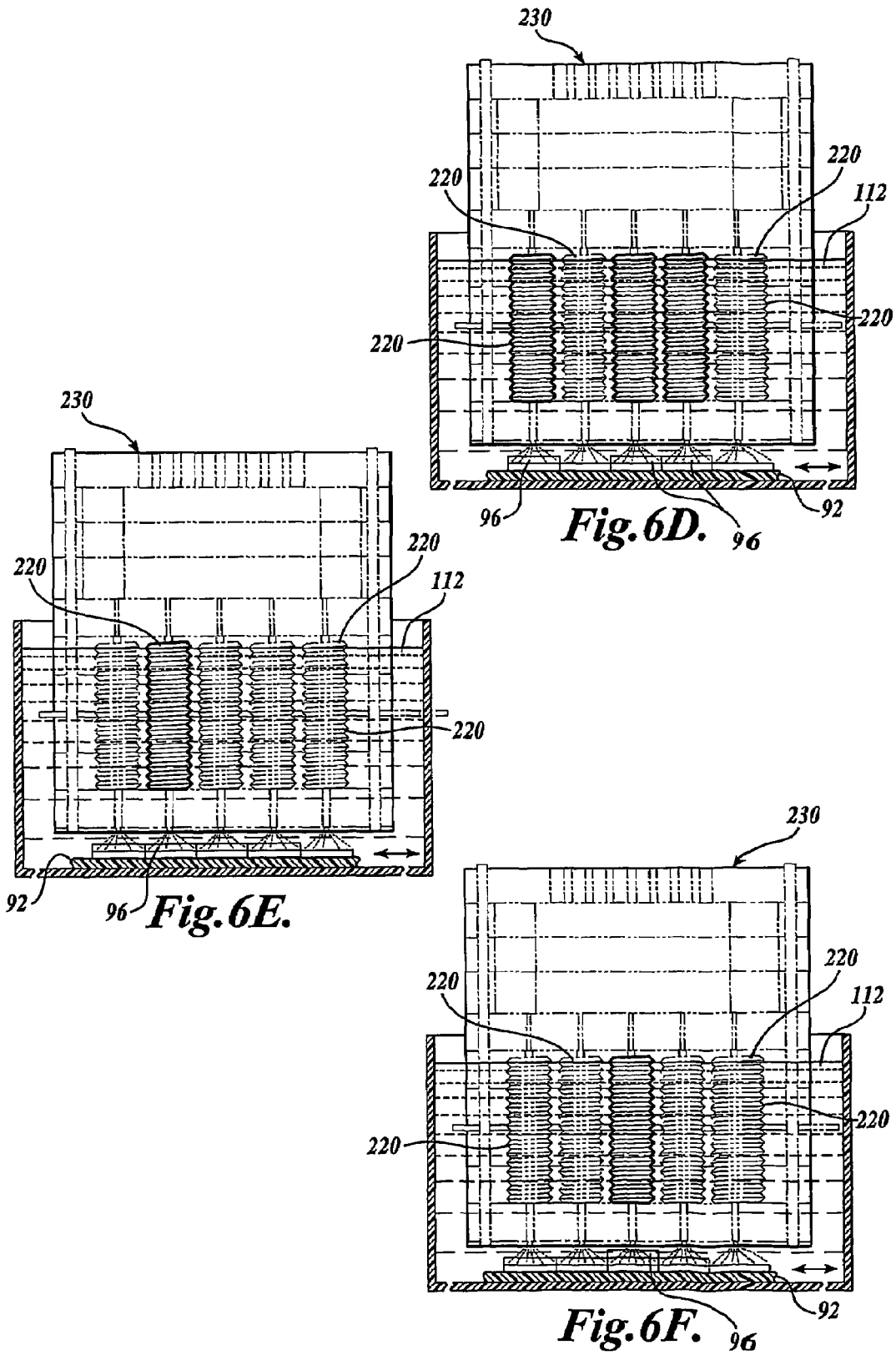

ELECTROCHEMICAL MICROMANUFACTURING SYSTEM AND METHOD

CROSS-REFERENCE TO RELATED APPLICATION

This application claims the benefit of U.S. Provisional Patent Application No. 60/508,756, filed on Oct. 3, 2003, the disclosure of which is hereby expressly incorporated by reference, and priority from the filing date of which is hereby claimed under 35 U.S.C. § 120.

STATEMENT OF GOVERNMENT LICENSE RIGHTS

The invention was made with government support under Grant No. DMII-9978577 awarded by the National Science Foundation. The government has certain rights in the invention.

FIELD OF THE INVENTION

The present invention relates to electrochemical deposition and, more particularly, to the use of electrochemical deposition for micromanufacturing.

BACKGROUND OF THE INVENTION

The manufacture of microelectromechanical systems ("MEMS") is currently impaired not by the microelectronic side of MEMS, but rather by the micromechanical side. Microelectronics is now a mature art—and primarily a two-dimensional one. Micro-mechanics, however, is suffering from a prolonged adolescence, its development having been hindered by the attempts of its parents to make it "wear its sibling's old clothes." While microelectronic components are substantially two dimensional, it is desired that micromechanical components have significant features in the third dimension. Despite this, the majority of micromechanical devices are produced using the inherently 2D methods of lithography-based microelectronics fabrication. Some of these methods have been tailored to produce structures with significant thickness, for example, LIGA (lithography, electroplating, and molding), and thick UV photolithography for electrodeposition, bulk silicon micromachining, silicon direct bonding, etc., but the drawbacks are still present—namely, the reliance of mask sets and the associated labor when it comes to changing device design (which requires another mask set). Additionally, the three-dimensional complexity attainable with such methods is limited; the number of layers rarely exceeding a few dozen. Finally, these processes must be performed in a cleanroom facility, representing a substantial capital investment for a would-be micromachinist.

We have developed an electrochemical printing system that seeks to remedy the micromachinist's plight. The system is capable of producing two-dimensional multimaterial patterns. In its present form, it is ideally suited for custom bump-plating for high-density interconnect flip chips, as well as printed circuit board metallization and repair. Extending the method to the third dimension requires repeated printing of patterned layers comprised of functional-material along with a sacrificial support material. The ability to print multilayer patterns will have a significant impact on both prototyping and direct custom manufacturing of MEMS devices. A method of using the system for custom three-dimensional packaging is also described.

The MEMS Exchange (www.memsnet.org) cites the two main challenges facing the microelectromechanical systems ("MEMS") community as—(1) insufficient access to MEMS fabrication facilities; and (2) an entanglement of the MEMS design process with the inherent complexities of current fabrication methodologies. Both of these issues stem from the following fact that conventional mask-based microelectronic fabrication processes are still the predominate means of MEMS prototyping.

These problems lie predominately on the micromechanical side of MEMS. While the mask-based fabrication of essentially two-dimensional microelectronic components is a well-established art, a flexible method for producing the arbitrary 3-D geometries ideal for micromechanical components has yet to be found. This sought-after process would ideally be capable of tailoring not only the geometry, but also the material properties in three dimensions, creating parts from so-called functionally graded materials ("FGMs"). The process must also be compatible with existing IC fabrication methods, especially in regard to the required processing temperatures. In lieu of developing such a tool, the MEMS community has thus far made do by adapting existing mask-based microelectronics fabrication techniques to meet some of the above demands. Specifically, significant z-dimensionality has been achieved using mask-based methods by the following strategies—(a) fabricating consecutive layers one on top of the other (e.g., surface silicon micromachining); (b) bonding individual layers after their respective fabrication (e.g., silicon-direct bonding); and (c) producing substantially thick individual layers, either by additive (e.g., LIGA and UV thick-resist lithography) or subtractive (e.g., bulk silicon micromachining) processes.

Tethering the process to lithographic masks, however, limits the number of layers that can feasibly be incorporated in the micromechanical structure, thus constraining design freedom and three-dimensionality. Design iterations are belabored by the need for a new mask or mask set for each alteration, prolonging the design-test phase of a MEMS product's lifecycle. Furthermore, the mask dependency typically requires that fabrication be conducted in a cleanroom facility, which represents a substantial cost to the designer.

Alternatives to mask-based micromachining are currently being developed, most of which are seeking to embody the tenets of "Solid Freeform Fabrication" ("SFF"). SFF has its origins in Rapid Prototyping, which was defined in the Rapid Prototyping Report, October 1992, as:

> The fabrication of a physical, three dimensional part of arbitrary shape directly from a numerical description—typically a Computer Aided Design model, by a quick, highly automated and totally flexible manufacturing process.

One of Rapid Prototyping's central goals is to reduce the time it takes to fabricate a testable device, thus expediting product development. Due to the limited materials available for most rapid prototyping processes, these tests are typically limited to form-fit testing. If the above definition is further extended to producing functional devices with the desired geometry AND material properties (the ideal of which are devices made of functionally graded materials), it becomes SFF, (alternatively referred to as "Direct Fabrication" and/or "Rapid Manufacturing"). Whatever the title, such a process applied to MEMS and available at a comparatively modest cost would give a lithography-wearied MEMS designer reason to rejoice.

The basis behind solid freeform fabrication is layered fabrication, building cross-section upon cross-section until the entire device is constructed. SFF is similar in this regard to mask-based microfabrication; however, this is where the similarity ends. SFF builds the layers rapidly, enabling high resolution in the z-direction and flexibility, producing the layers by fully automated computer control. It is therefore much like desktop printing extended to a third dimension.

Among the techniques being employed to direct-manufacture FGM parts is "3D Printing," which forms each 2D cross-section of the device by selectively applying liquid binder droplets roughly 100 µm in diameter to a layer of powder. The composition can thus be varied by using different binders in much the same fashion as different inks are applied in inkjet printing. The finished parts, however, can be fragile and porous. Additionally, it may be difficult to remove the excess/nonbound powder from the cavities within the part. Alternately, a $CO_2$ laser can be used to selectively sinter the powder at desired locations, as in Selective Layer Sintering. This process suffers from disadvantages similar to those of 3D Printing, however, in that the resulting part is porous. An additional complication, owing to the necessary heating of the powder, is the potential for thermal distortion of the part. Other processes, which do not involve powder layers, deposit individual droplets of build material to build the device. Shape Deposition Manufacturing does this by depositing 1-5 mm diameter drops of molten metal using a process called "microcasting." Particular relationships must exist between the sacrificial/retained and retained i/retained i+1 materials' melting points and thermal conductivities in order for both (a) high strength bonding (via melt alloying) to occur between retained materials of different composition, and (b) easy removal of the sacrificial material after the build-up phase. A similar process is Ballistic Particle Manufacturing. The drops in this process are issued from a thermal spray nozzle and thus can have smaller diameters (50-100 µm), but must be selected from a more limited range of materials. One of the more promising FGM-SFF techniques is Laser Assisted Net Shaping, where several jets of metal particles are directed at a high-power laser's focal point. The laser heats the metal powders and causes them to melt and stick onto the substrate, with molten pool diameters ranging from ½ to 5 times the spot size of the laser. Composition gradients are obtained by varying the respective jets' flow rates during the deposition. A disadvantage associated with all processes involving deposition of molten or uncured materials, however, is the build-up of residual thermal stresses, which can cause warping and delamination in the finished product.

Among the techniques employing electrochemical reactions to direct-manufacture parts is the Electrochemical Fabrication process. This process has yet to sever all ties with masks, making it somewhat inflexible; however, its "instant masks" are far more flexible than ordinary lithographic masks. Electrochemical Fabrication applies these compliant masks directly to the anode (counter electrode) that drives the electrodeposition. An assembly line like process moves the substrate (working electrode) underneath a succession of such masks, which are each pressed to the substrate's surface during electroplating, thus depositing a metallic structure true to the pattern of the instant mask. The mask stamp is then lifted and the deposit backfilled with a second material, and planarized before proceeding to the next instant mask. Lastly and most similar to our disclosed invention, is the localized electrodeposition method of Hunter and Madden. This method employs a sharpened electrode, positioned very near the substrate, to drive an electrodeposition reaction in a confined region immediately beneath the electrode's tip. Their demonstrated embodiment relies on diffusion and migration to deliver the depositing species to the reaction zone and moving the tip in three dimensions results in the creation of a three-dimensional line of nickel. The associated patent (U.S. Pat. No. 5,641,391), however, includes an alternative embodiment wherein a nozzle provides forced convection at the reaction zone.

We propose herein a rapid and flexible method for electrochemically producing two-dimensional multimaterial patterns directly from a computer using bitmap graphics files as the exchange medium. The invention controls the size and location of localized electrochemical reaction zones to produce or remove dots of different materials—a plurality of such dots results in a two-dimensional pattern. The method can be extended to produce complex three-dimensional objects by creating multiple two-dimensional patterns on top of one another and optionally selectively dissolving at least one material from the finished "stack" to give a three-dimensionally complex part.

SUMMARY OF THE INVENTION

An electrochemical printer head is disclosed for electrolytically depositing material onto or removing material from a conductive substrate. In a preferred embodiment, the printer head includes a plurality of electrodes, each electrode defining an axial channel therethrough. The electrodes are individually addressable, such that each electrode may be individually energized in an electrical circuit between the electrode, electrolyte and conductive substrate. A high electrical resistance system is provided for distributing the electrolyte to the individual electrodes. For example, a cross-talk inhibition layer may be provided upstream of the electrodes and made from a nonconductive material. The cross-talk inhibition layer having one or more narrow apertures therethrough defines a flow path to the electrodes. It is contemplated that alternatively independent flow systems may be provided to each electrode or to subsets of electrodes. A resolution-defining layer is provided below the plurality of electrodes, the resolution-defining layer having a number of relatively small apertures that provide an outflow path for the electrolyte from the electrode channels. The printer head provides a very high deposition rate and can be used to build, or print, three-dimensional structures. Moreover, by varying the electrolyte flow rate(s), applied power, and relative positions, the physical properties of the deposited material may be varied on the fly, producing a functionally-graded material. For example, a portion of the deposited material may be a material that is readily dissolved or etched away, such that the remaining material forms a desired, complex three-dimensional shape.

An electrochemical printer system utilizing the printer head is also disclosed, the system including a source of pressurized electrolyte, an electrical power source, and a mechanism for containing the substrate and electrolyte and for moving the substrate and the printer head relative to each other.

In an embodiment of the invention, the electrodes are relatively massive and formed from a material, such as stainless steel, that is substantially nonreactive and robust in the electrolyte.

A method for producing a functionally-graded material deposit is also disclosed, the method including the steps of providing a conductive substrate in a container containing a liquid electrolyte, providing an electrochemical printer head having a plurality of electrodes with a channel therethrough, the electrochemical printer head having a surface positioned in close proximity to the conductive substrate, wherein the electrochemical printer includes a plurality of flow paths therethrough, at least some of the flow paths including at least one of the electrode channels, providing electrolyte under pressure to the electrochemical printer head such that electrolyte flows through at least some of the plurality of flow paths and is expelled toward the conductive substrate, selectively applying an electric potential between the conductive substrate and at least one of the plurality of electrodes such that a circuit is formed between the electrode, the electrolyte, and the conductive substrate, and varying the flow rate of the electrolyte through the electrochemical printer head and a parameter of the applied electric potential to produce a functionally graded material deposit.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 3A-3L show plan views of the various layers, including the bonding layers, for the electrochemical printer head shown in FIG. 2;

FIGS. 6A-6F show a sequence of steps in depositing material on a substrate using the printer head of FIG. 2.

DETAILED DESCRIPTION OF THE PREFERRED EMBODIMENT

The present invention will now be described with reference to the figures, wherein like numbers indicate like parts.

Figure 1:
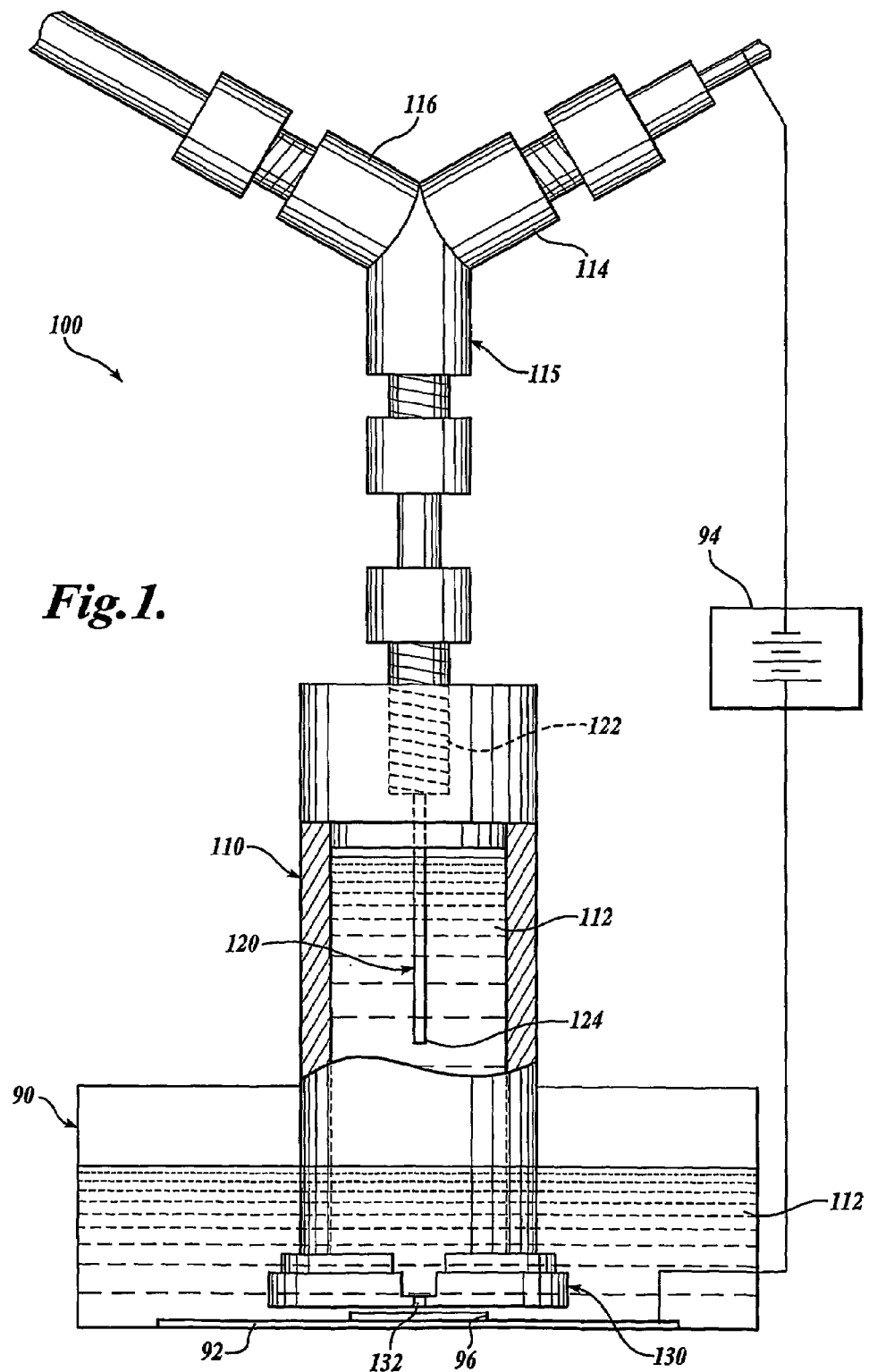
FIG. 1 shows a partially schematic single pixel prototype first embodiment of an electrochemical printing system according to the present invention.

A single-pixel prototype embodiment of an electrochemical printing system 100 is shown in FIG. 1. The electrochemical printing system includes a head adapter 110 that is at least partially filled with an electrolyte 112. A counter electrode 120, for example, a platinum wire counter electrode, extends through a port opening 122 into the head adapter 110 and into the electrolyte 112. In the disclosed embodiment, the counter electrode 120 is threaded through one input port 114 of a Y-adapter 115, wherein a distal portion 124 of the counter electrode 120 is immersed in the electrolyte 112. The second input port 116 of the Y-adapter 115 is connected to a pressurized source of electrolyte 112, such that replenishing electrolyte is provided under pressure to the head adapter 110.

A printer head 130 is attached to the lower end of the head adapter 110. The printer head 130 and the head adapter 110 preferably are made from a relatively inert material that will not react with the electrolyte 112. A small aperture 132 extends through the printer head 130 such that the pressurized electrolyte 112 is expelled from the printer head 130, forming a liquid jet. The printer head 130 is disposed in a container 90 partially filled with electrolyte 112. A conductive substrate 92 is located directly below the printer head 130, such that the fluid jet impinges on the substrate 92. In an embodiment of the invention, the head adapter 110 and the printer head 130 are formed from acrylic, and the small aperture 132 has an exit diameter of around 150 microns. The aperture 132 is widened at the top by drilling partly through the layer to reduce the electrical resistance through the aperture 132.

A current or voltage is applied across the counter electrode 112 and the conductive substrate 92, as indicated schematically by the battery symbol 94. It will now be appreciated by persons of skill in the art of electroplating that an electrical circuit is formed between the counter electrode 120 through the electrolyte 112 (and, in particular, through the jet of electrolyte expelled from the aperture 132) and through the conductive substrate 92. By a well-known electrolytic deposition process, with the appropriate selection of electrolyte 112 and current/voltage levels, a desired deposition of material 96 onto the conductive substrate 92 is achieved. As discussed in more detail below, a mechanism (not shown in FIG. 1) for moving the substrate 92 and/or the printer head 130 may be provided to change the relative position of the printer head 130 with respect to the substrate 92, whereby a desired shape of the deposition material 96 may be achieved. In particular, it is contemplated that the distance between the printer head 130 and the substrate 92 may be varied, for example, to allow multiple layers of deposition material 96 to be applied to build up a three-dimensional structure.

It will be appreciated that the deposition of material at any given time occurs primarily at a very small location directly below the printer head aperture 132, which small spot will sometimes be referred to herein as a pixel. By selectively moving the printer head 130 and/or the conductive substrate 92, the pixel location may be moved to achieve a desired shape in a manner analogous to conventional ink jet printers. Moreover, by making multiple passes over the same location, layers of material may be built up to achieve a complex three-dimensional shape. It has been found through the present invention that the material deposition rate achievable using a small jet (micro jet) of electrolyte at the point of deposition can be surprisingly rapid. Extraordinary build rates greater than 20 microns/second have been achieved, which build rates are ten times faster than some of the best mask-based systems. The extraordinary build rates are achieved by controllably varying the electroplating parameters, such as the electrolyte jet speed, applied voltage/current, printer head speed, and gap between the printer head and the substrate (or deposition material).

Moreover, the material properties of the deposition material may be selectively and purposefully varied on the fly. For example, in an iron-nickel electrolyte (NiFe), by selectively controlling the local electrical current and electrolyte flow rate, the relative iron and nickel composition of the deposition material may be altered on the fly, producing iron-rich depositions in some locations and nickel-rich depositions in other locations. Using known techniques, the iron-rich depositions (sacrificial depositions) may be subsequently preferentially etched away. The iron-rich depositions, therefore, provide mechanical support during the printing process and can then be substantially removed to create complicated three-dimensional shapes.

It will also be appreciated that the present methodology and apparatus (with modifications that will be readily apparent to the person of skill in the art) may be utilized for electrolytic deposition of a very wide range of diverse materials, including, for example, many metals, alloys, semiconductors, ceramics, conducting polymers (such as polyaniline and polypyrrole), and proteins. Electrolytically depositable materials are well known in the art and disclosed in the literature and therefore there is no need to list such materials here.

A multi-pixel electrodeposition printer head 230 will now be described with reference to FIG. 2. This illustrative electrodeposition printer head 230 is made using a layered fabrication scheme. The printer head 230 includes a flow distribution layer 235, a plurality of flow plenum layers 240, a cross-talk inhibition layer 245, a pair of epoxy overflow layers 250, a pair of epoxy layers 255, a lead interconnect layer 260, a low-impedance flow transition layer 265, and a resolution defining layer 270. A plurality of counter electrodes 220 (five shown) is embedded in the printer head 230. For ease of manufacture, the layers 235, 240, 245, 250, 255, 260, 265, and 270 are aligned during fabrication using a pair of alignment pins 275. It will be appreciated that the current embodiments of the electrochemical printing systems disclosed herein are development apparatus, and it is anticipated that other materials and configurations may be selected without departing from the present invention. For example, although "epoxy" is used throughout this description of the current embodiment for the material structurally supporting the electrodes 220, other insulating material may alternatively be used.

The flow distribution layer 235 includes a number of through apertures 236 that provides a fluid path wherein the electrolyte enters a plenum 241 defined by the flow plenum layers 240 The flow distribution layer 235 and plenum 241 provide a generally uniform pressure in the electrolyte prior to encountering the plurality of electrodes 220. The cross-talk inhibition layer 245 is an electrically insulating layer having relatively small diameter apertures 246 therethrough. It will be appreciated by the artisan that the cross-talk inhibition layer 245 greatly increases the electrical resistance between the electrodes 220, thereby reducing the undesirable flow of current between electrodes 220 through the electrolyte, as discussed in more detail below.

The electrodes 220 extend through the epoxy overflow layers 250, the epoxy layers 255, and through apertures 261 in the lead interconnect layer 260. The electrodes are held in place by an epoxy 256 and are electrically connected to individual electrical leads 264 (FIG. 3I) in the lead interconnect layer 260 such that the counter electrodes 220 can be selectively individually energized. The counter electrodes 220 include an axial channel 222 therethrough that is generally aligned with the apertures 246 in the cross-talk inhibition layer 245. The low-impedance flow transition layer 265 includes a plurality of apertures 266 therethrough, which is also generally aligned with the axial channels 222 through the counter electrodes 220. Finally, the relatively thin resolution defining layer 270 disposed at the bottom of the printer head 230 includes a plurality of relatively small-diameter apertures 271 therethrough that is generally aligned with the apertures 266 in the flow transition layer 265.

The electrolyte enters the plenum 241 in the printer head 230 through the apertures 236 in the flow distribution layer 235 and flows through the apertures 246 in the cross-talk inhibition layer 245, through the channels 222 in the electrodes 220, through the apertures 266 in the flow transition layer 265 and out through the small apertures 271 in the resolution defining layer 270.

In manufacturing this embodiment of the printer head 230, a laser cutting system—for example, the Universal Laser Systems' Model M-25—may be used to precisely cut each layer from the desired materials, although any other suitable fabrication method may be utilized, as is well known in the art. The layers are then bonded together with a pressure-applied bonding layer that may be first precisely laser cut to the desired shape. A plan view of each of the layers, including suitable bonding layers, is shown in FIGS. 3A-3K. In particular, FIG. 3A is a plan view of the flow distribution layer 235, showing the flow apertures 236. Alignment apertures 237 are provided in opposite corners of the flow distribution layer 235 that are sized to slidably engage the alignment pins 275 (FIG. 2). The flow plenum layer 240 is shown in FIG. 3C, also showing alignment apertures 242. A first bonding layer 238 for use with the plenum layers 240 is shown in FIG. 3B. The cross-talk inhibition layer 245, epoxy overflow layer 250, and epoxy layer 255 are shown in FIGS. 3D, 3F, and 3H, respectively, showing alignment holes 247, 252, and 257. In particular, a large aperture 259 for the epoxy is shown in the epoxy layer 255. It will be appreciated from FIG. 2 that the large aperture 259 provides a volume for receiving the epoxy 256. A second bonding layer 248 suitable for use between the cross-talk inhibition layer 245 and the epoxy overflow layer 250 is shown in FIG. 3E, and a third bonding layer 253 for use with the epoxy layers 255 is shown in FIG. 3G.

The lead interconnect layer 260 is shown in FIG. 3I. The lead interconnect layer 260 is larger than the other layers and therefore extends outwardly from the printer head 230 for connection to a control system (not shown). The lead interconnect layer 260 includes apertures 261 through which the counter electrodes 220 extend, and a plurality of elongate electrical leads 264 that electrically connect to individual electrodes 220. Alignment apertures 262 are also provided.

The flow transition layer 265 and resolution defining layer 270 are shown in FIGS. 3J and 3L, respectively, showing alignment apertures 267, 272. It will be appreciated that the small apertures 271 in the resolution defining layer 270 will determine the size of the jet of electrolyte that issues from the printer head 230. In general, smaller apertures 271 will result in smaller dimension pixel deposition sizes. A fourth bonding layer 268 is shown in FIG. 3K.

It will be readily appreciated that an electrochemical printer head may be made with fewer and/or additional layers without departing from the present invention. For example, it has been found beneficial to include a filter layer upstream of the flow distribution layer 235 to inhibit the introduction of particulates and preclude or limit clogging in the printer head 230. Similarly, it will be appreciated by the artisan that rather than utilizing a plenum to provide electrolyte to all of the electrodes, separate electrolyte feeds —for example, using multiple syringe pumps—may be provided to each electrode or to separate groups of electrodes. This would have several advantages, including permitting the use of different electrolytes, further enhancing the flexibility of the system, eliminating cross-talk between the electrodes, and eliminating the need for a plenum and flow distribution layer.

Figure 4:
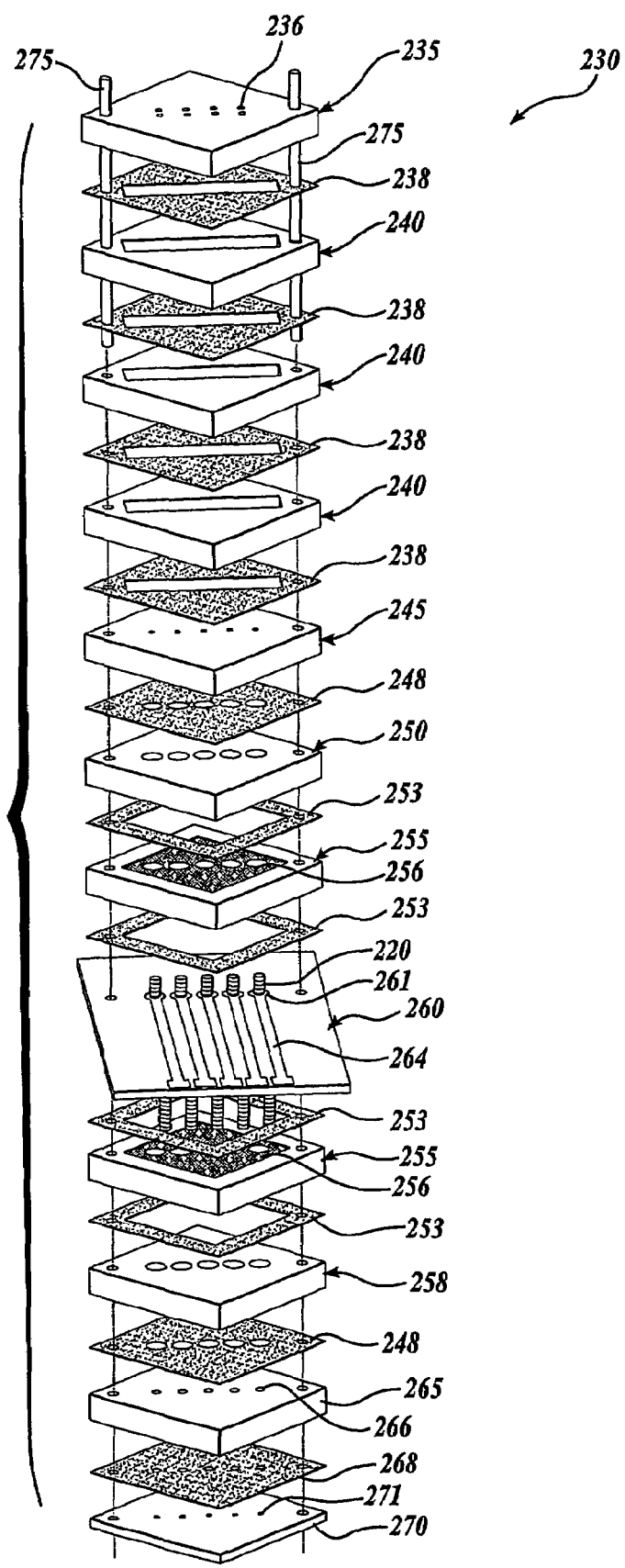
FIG. 4 shows an exploded view of the electrochemical printer head shown in FIG. 2.

In a preferred embodiment, the printer head 230 is assembled as follows, referring now also to FIG. 4 that shows an exploded view of the printer head 230. The electrical leads 264 are applied to a substrate using a commercial electroless silvering solution and a laser-cut mask of PVC low-tack wafer dicing tape. In the prototype device, the bonding pads for these leads 264 are spaced such that an integrated circuit test clip (not shown) can be easily and effectively clamped to the interconnect layer 260. The present mask allows for two of the clips' test leads to contact each bonding pad. The mask is applied to 0.3 µm Al2O3-embedded Mylar® (polyethylene terephthalate) lapping film, which is subsequently soaked briefly in 12 M NaOH prior to silvering. It is believed that the alkaline soak both degreases the lapping film and etches some of the alumina, adding to the surface roughness of the film and increasing mechanical adhesion of the silver deposit. It is contemplated that other alternative interconnect approach may be used—for example, utilizing conventional flex—circuit manufacturing techniques to produce metallized lines on a polyimide film. After the alkaline soak, the mask/lapping-film assembly is rinsed with deionized water and processed in the electroless silver plating solution according to the manufacturer's instructions. After rinsing with deionized water, the mask is removed and the lead interconnect layer 260 dried.

The epoxy layers 255 are then affixed to either side of the lead interconnect layer 260 using the third bonding layers 253, which are precisely cut from double-backed adhesive polyethylene terephthalate film. Assembly is simplified using 1/16" stainless steel alignment pins 275.

Figure 2:
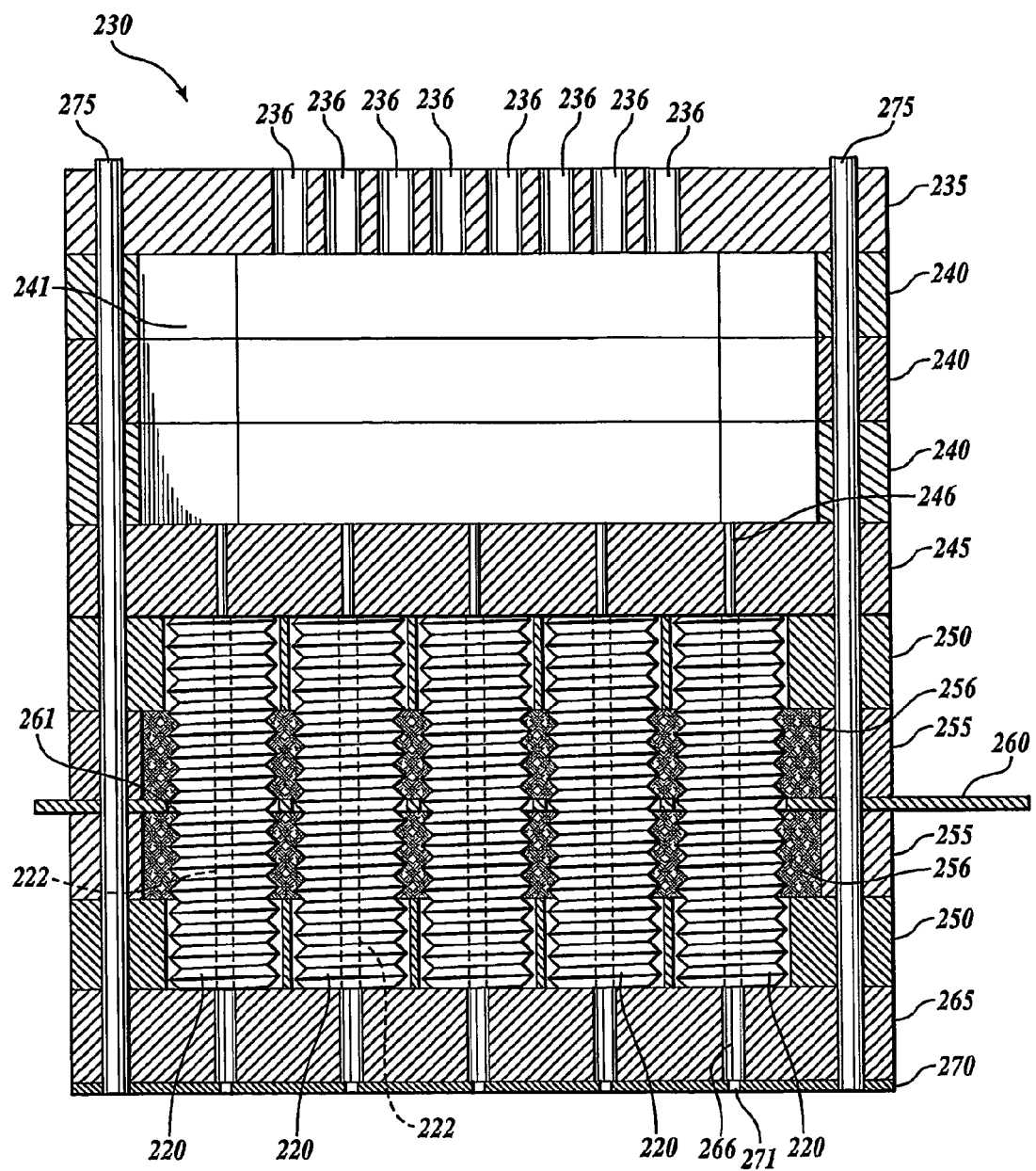
FIG. 2 shows a cross-sectional view of a second embodiment of an electrochemical printer head according to the present invention.

In a novel aspect of the embodiment disclosed in FIG. 2, it has been found advantageous to use relatively massive stainless steel setscrews for the counter electrodes 220. This choice arose after observing the short life of print heads that were made using thin film noble metal electrodes—for example, sputtered gold on a TiW adhesion layer. Thin film noble metal heads disintegrate rapidly at appreciable currents, whereas the preferred more massive setscrew electrodes 220 provide for long electrode life even with very large currents. It will be apparent from FIG. 2, for example, that the electrodes 220 are much larger in the transverse dimension than the apertures 271 in the resolution defining layer 270. The relatively massive electrodes may alternatively be made of other suitably nonreactive electrode material, such as gold. The electrode material is from materials that will not corrode too rapidly in the electrolyte environment. The setscrew electrodes 220 are threaded through the apertures 261 in the lead interconnect layer 260, such that the leads 264 are electrically in contact with the electrodes 220 and the lead interconnect layer 260 is roughly centered along each electrode's 220 length. The electrodes 220 are then mechanically supported by potting them, for example, using an epoxy 256, in the epoxy layers 255. Assembly by bonding the remaining layers using the alignment pins 275 substantially completes the printer head 230, as shown in FIG. 4.

In the current version of the printer head 230, the flow distribution layer 235, plenum layer 240, cross-talk inhibition layer 245, epoxy overflow layer 250, epoxy layer 255, and flow transition layer 265 were cut from 1/8 inch thick acrylic sheet with polyimide backing. The resolution-defining layer 270 is cut from a 1-mil thick Mylar® sheet. The apertures 236 in the flow distribution layer 235 and the apertures 266 in the flow transition layer 265 are approximately 0.254 inch in diameter, whereas the apertures 271 in the resolution defining layer 270 are significantly smaller—approximately 0.002 inch in diameter. Although precut bonding layers 238, 248, 253, 268 are shown and may be formed, for example, from a pressure-sensitive or touch-sensitive sheet of bonding material, as is known in the art, it will be appreciated that other layered fabrication methods may be used to construct the printer head 230.

Figure 5:
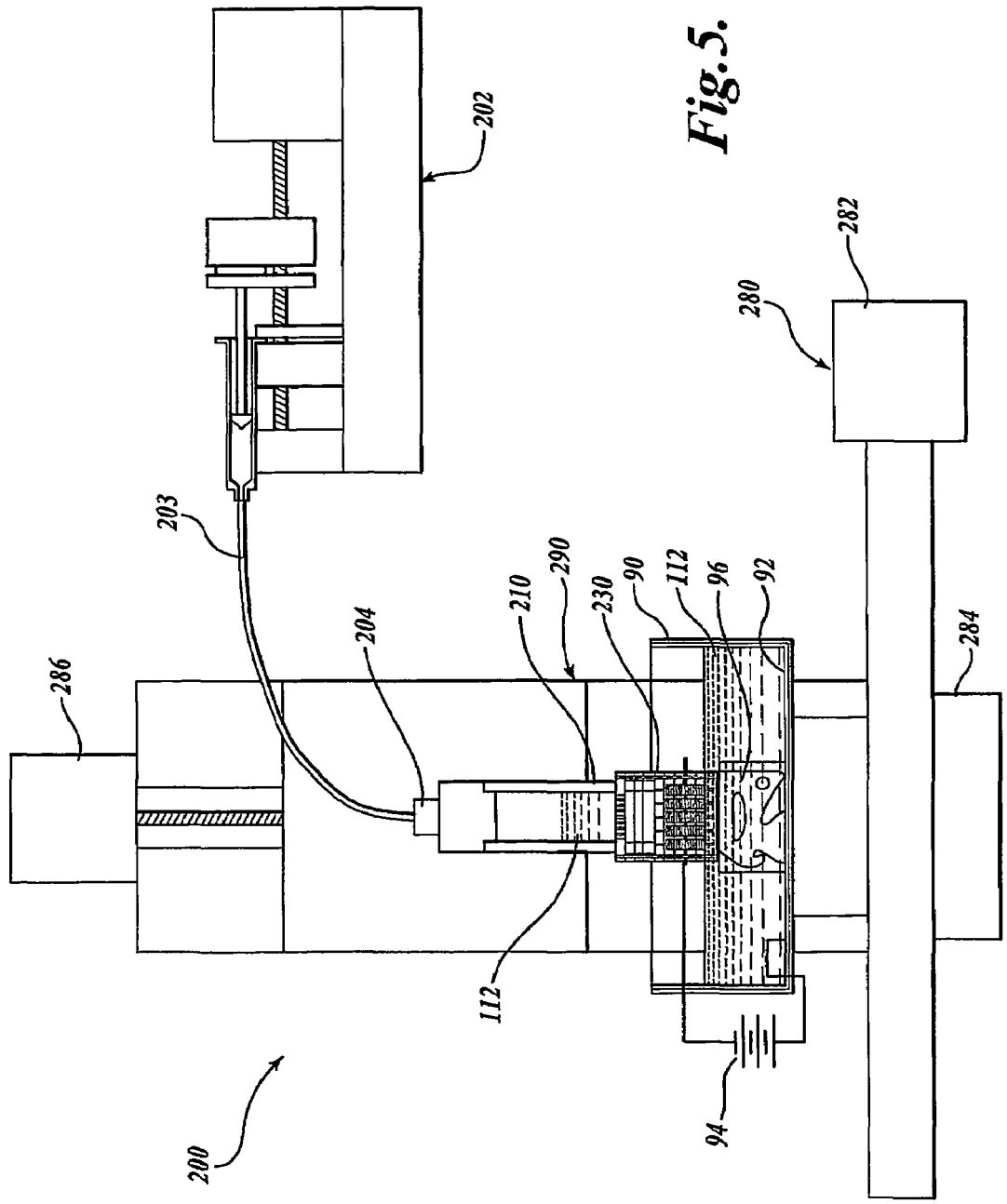
FIG. 5 shows quasischematically an electrochemical printer system printer utilizing the printer head shown in FIG. 2.

FIG. 5 shows a second embodiment of an electrochemical printer system 200, showing a front view of the printer head 230 mounted on a head adapter 210, similar to the head adapter 110 shown in FIG. 1. The printer head 230 is disposed in a container 90 partially filled with electrolyte 112. A conductive substrate 92 is attached to the container 90 and immersed in the electrolyte 112 such that the printer head 230 can electrodeposit material 96 onto the substrate 92. Replenishing electrolyte 112 is provided under pressure to the head adapter 210 by a syringe pump 202 shown schematically in FIG. 5. Although a syringe pump 202 is shown, it is contemplated that the electrolyte may be provide by any number of conventional mechanisms, for example, utilizing other types of liquid pumps or by providing electrolyte from a pressurized reservoir source. Alternatively, multiple syringe pumps may be used to deliver different electrolytes to different pixels, with suitable modification to the plenum and fluid distribution layer. A milling apparatus or motion control device 280 is attached to the container 90 and/or the printer head 230. In the embodiment shown schematically in FIG. 5, the motion control device 280 includes an x-axis actuator 282 and a y-axis actuator 284 that are attached to the container 90 for selectively moving the container 90 and conductive substrate 92 in the x-y plane. A z-axis actuator 286 is connected to the printer head 230, for example, by adapter 290, such that the printer head can be moved vertically, relative to the conductive substrate 92.

To aid the reader, examples of suitable components utilized in the inventors prototype of the present invention are described below. In particular, it will be appreciated that the selected components discussed below are not intended to limit the present invention, but rather were selected in the prototype development of the present embodiment of the invention.

In the currently preferred prototype, the motion control device 280 is a computer-controllable, three-axis mini-mill. The software is programmed in National Instruments' LabView 6.1 and integrates control of motion, fluid flow, multiplexing, and voltage/current sourcing and measuring. The software incorporates VI's (Virtual Instruments) issued in National Instruments' Flex-Motion, NI-Switch, and NI-DAQ VI libraries.

A Windows 2000® operating system running on an AMD Athlon-based personal computer serves as the primary controller (not shown). Motion control is accomplished with a MAXNC-5 three-axis mini-mill purchased from MAX-NC (Chandler, Ariz.), in conjunction with National Instruments' PCI-7344 motion controller card and UMI-7764 terminal block. The step/direction signals from the controller card are converted to phase-drive signals using three UCN5804B stepper controller ICs, one for each axis, and routed through a 25-pin D-subminiature connector/cable to the MAXNC-5. A Keithley 2400 SourceMeter (not shown) supplies the current/voltage to the electrochemical print head's pixels and measures the voltage/current during pixel activation. The associated signals are passed to and from the controlling PC through National Instruments' PCI-GPIB card. The user has the choice of operating the Keithley as a simple two-wire power supply or as a three-wire potentiostat/galvanostat with a reference electrode. Multiple or individual pixels are addressed through closing specified switches in National Instruments' SCXI-1127 switching module (not shown). The module is housed in National Instruments' SCXI-1000 four-slot chassis and controlled from the PC's PCI bus using National Instruments' PCI-4021 switch controller card. The Keithley is interfaced to the switching module through the high-voltage analog back plane of the SCXI chassis.

Flow control is accomplished with a four-syringe push-pull syringe pump, Model sp260p, purchased from World Precision Instruments. The controlling PC's serial port communicates with the pump using RS-232 commands.

Operation

At the core of the system is the electrochemical print head 230, which is secured to the head adapter 210. The head adapter 210 is attached to the z-axis actuator 286 of the mini-mill motion control device 280. The syringe pump 202 forces electrolyte 212 through a 1/8" inch OD Teflon® tubing 203. The tubing 203 is attached to the head adapter 210 with a flangeless fitting 204. A circuit is formed from the electrode of the print head 230 through the interstitial electrolyte 212 to the conducting substrate 92. The conducting substrate 92 may be formed, for example, as a glass slide sputtered with TiW/

Au The functionally graded part (deposition material) 96 is fabricated optionally including co-deposited sacrificial support material. The substrate 92 is secured to an open-top container 90 that serves as a receptacle for excess electrolyte 212.

Referring again to FIG. 2 showing the printer head 230 in cross-section, the flow distribution layer 235 distributes the flow relatively equally over all pixels by promoting turbulence. The plenum 241 defined by flow plenum layers 240 allows the flow to develop (in the case of injection). The cross-talk inhibition layer 245 reduces the "up-and-over" pathway for current to pass from one activated pixel to the region beneath a neighboring non-activated pixel. The epoxy overflow layers 250 provide a region for excess epoxy to escape during head assembly without clogging the electrodes 220. The epoxy layers 255 define a volume containing the epoxy 256 that mechanically secures the electrodes 220. The metalized lead interconnect layer 260 is where electrical contact to the individual electrodes 220 is made. The flow transition layer 265 reduces the diameter of the flow channel to prevent excessive flexion of the membranes formed by the resolution-defining layer 270. The counter electrodes 220 are preferably drilled-through stainless steel setscrews. The layers are aligned during assembly with the assistance of stainless alignment pins 275 and their corresponding alignment holes drilled through every layer.

In the currently preferred mode of operation, the electrolyte 212 is injected under positive pressure from top to bottom, thereby forming a jet generally at the substrate 92. Alternatively, the electrolyte may be sucked from bottom to top with a negative pressure provided by the syringe pump 202. In either case, both the current density and mass transfer are substantially confined to well-defined regions on the underlying substrate 92. Each "pixel" comprises an independently addressable electrode 220 capable of producing a localized electrochemically formed feature on the substrate 92 underlying the aperture 271 in the resolution-defining layer 270. Thus the printer head 230 can produce small "dots" of electrodepositable material (either anodically or cathodically formed) or, alternately, small regions where material has been electrochemically removed.

Figure 6A:
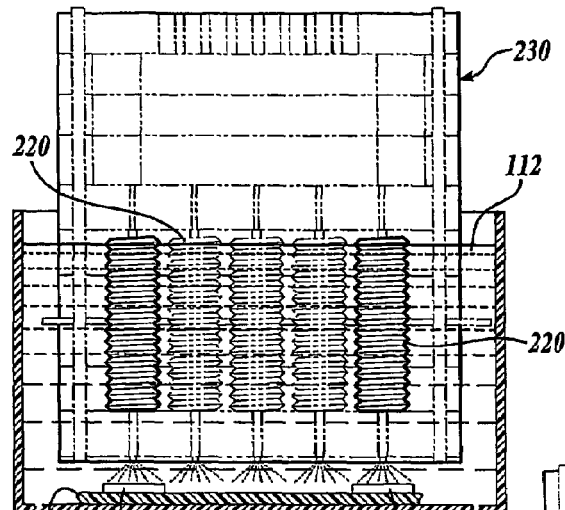
Figure 6B:
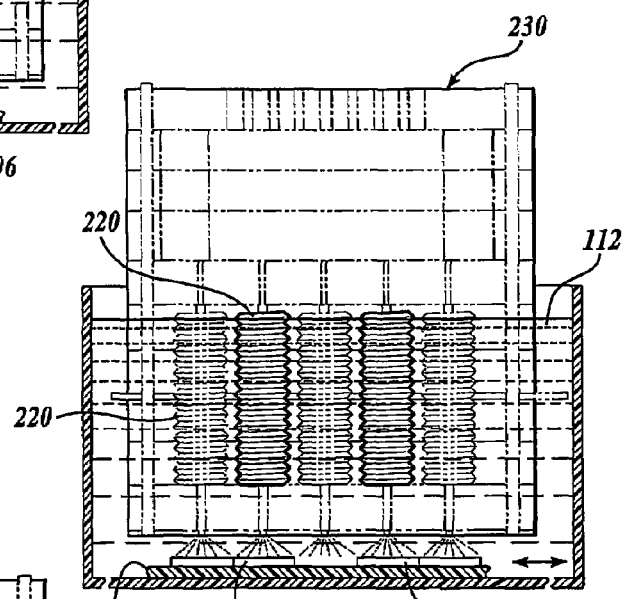
Figure 6C:
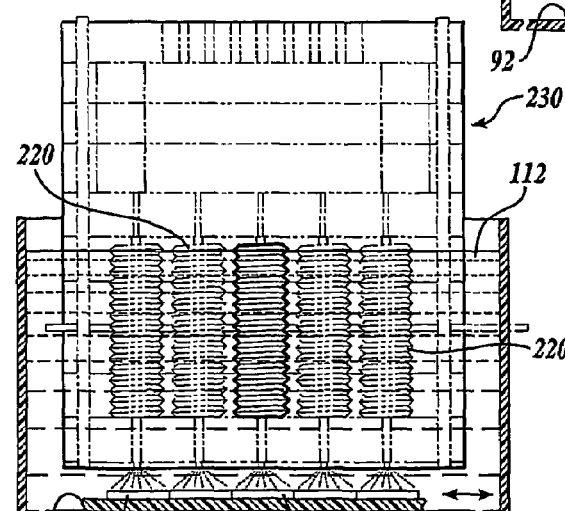

Two-dimensional patterns are created as shown in the exemplary sequence shown in FIGS. 6A-6F, wherein portions of the printer head 230 are shown in phantom and peripheral system components are not shown, for clarity. Although not shown, it should be kept in mind that electrolyte 112 is continuously flowing through the printer head 230 through the counter electrodes 220, and contacting the conductive substrate 92. In FIG. 6A, the first and fifth electrodes 220 are energized such that current flows primarily between the energized electrodes 220 and the substrate 92, causing a deposition 96 to occur on the substrate 92 below the energized electrodes 220. The FIGS. 6B-6F show sequential deposition steps, wherein the substrate 92 may be selectively moved (as indicated by the arrows) to achieve a desired pixel deposition location. It will be appreciated, as discussed above, that by selecting an appropriate electrolyte and selectively controlling the electrode current and flow rates, the material properties of the depositions 96 may be controlled on the fly. It will also be appreciated that the printer head 230 may be moved vertically away from the substrate, to build up a three-dimensional deposition pattern. The process is conceptually similar to dot-matrix or ink-jet printing, where multi-colored 2-D images are created by controlled placement of dots of different colored inks onto a sheet of paper; the present invention, however, electrochemically creates dots of substantial thickness on a conducting substrate and, instead of varying color, varies the material composition of the dot.

Figure 7A:
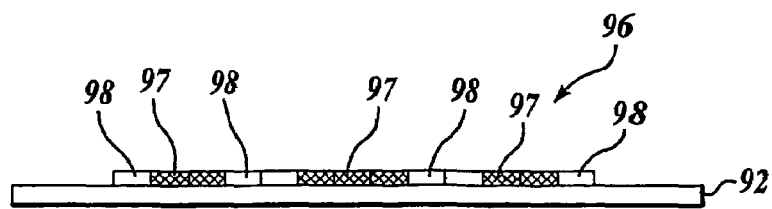
FIGS. 7A-7E show the steps in a process for forming a complex three-dimensional object using the electrochemical printer system shown in FIG. 5.
Figure 7B:
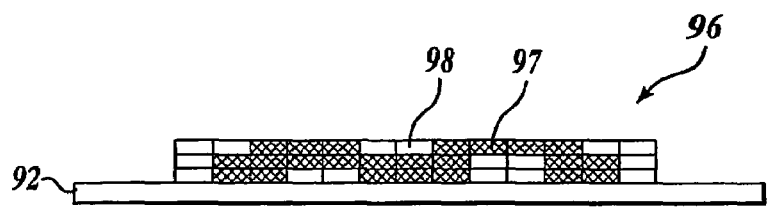
Figure 7C:
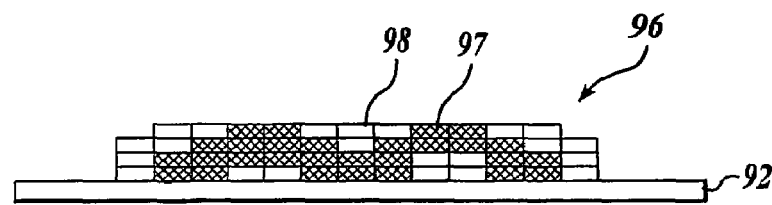
Figure 7D:
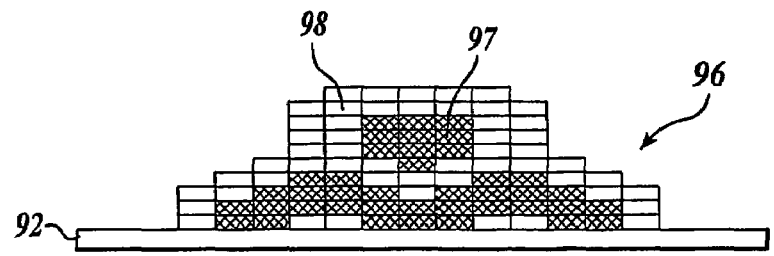
Figure 7E:
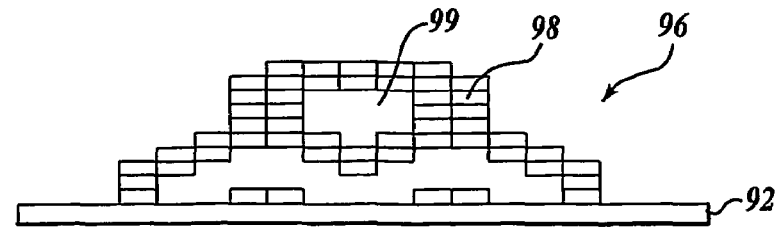

The sequence shown in FIGS. 7A-7E show the build-up of deposition material 96 on a substrate 92, illustrating the process of creating a complex three-dimensional shape by printing subsequent layers on top of one another to define three-dimensional objects and etching away a portion of the deposited material. Both sacrificial support material 97 and functionally-graded structural material 98 are deposited on the fly and the sacrificial material 97 is subsequently removed (typically by selective dissolution) at the end of the build process, leaving voids 99 as indicated in FIG. 7E. A large number of densely-packed pixels is desired so as to minimize the number of printer head 230 moves required to build a layer, thus minimizing the time to fabricate a given part.

Some Applications

The electrochemical printing system of the present invention can create two-dimensional patterns from discrete metal dots. The system is thus ideally suited to custom bump plating for flip-chip interconnects. It is also extendible to the metallization and repair of printed circuit boards.

An electrochemical printing system utilizing the printer head 230 has also been used for rapidly characterizing electrolyte baths. In particular, the system allows for creating arrays of dots, each deposited using a different combination of process parameters (in this case, flow and current). Composition mapping with EDX spectroscopy (or the like) is then used to determine the composition of each dot. This is especially useful for specifying composition (and/or other material properties).

As already mentioned, the present invention is suited to producing three-dimensional structures for MEMS. It has the added ability of incorporating nanostructure into an otherwise micro-scale device. Specifically, modulating the electrolyte flow and/or current density during deposition of a single dot can produce lamellae of different compositions. In the case of thin films, nano- and micro-scale lamellae have been shown to impart favorable and tailorable mechanical properties that are significantly different from that of the bulk, producing films that are tough, flexible, and springy. Moreover, the present invention has the ability to print through crystalline insulating phases, like colloidal and block copolymer films, that coat the substrate, thereby providing three-dimensional nanostructure in each build layer.

The system is flexible, producing parts directly from a series of bitmap images, and relatively inexpensive; these features make micromechanical prototyping more accessible and versatile.

A direct extension of the above application is the ability to produce three-dimensionally intertwined interconnects and packaging molds. The interconnects take the form of a retained material (forming the leads) embedded in a sacrificial support material. Retained material is also used to form the boundary of the package, forming the walls of a mold. After removing the support material, a low-viscosity insulating dielectric resin is used to fill around the interconnects and device, up to the walls of the mold. An initially applied vacuum is applied to remove the bulk of the voids, and a high pressure is subsequently applied during cure. Alternately, air could be used as the dielectric, eliminating the resin impregnation step. The resulting packaged device, however, would be more prone to breaking, as well as electrostatic attractions between the interconnects.

As mentioned, counter electrode dissolution plagued earlier trials with thin-film electrodes. It is contemplated that this dissolution can be advantageously exploited to locally enrich the electrolyte with the dissolution product, which would then be deposited at the substrate beneath the pixel. This holds several advantages over the present method. First, it reduces the amount of products from unwanted counter electrode reactions (e.g., proton enrichment through water hydrolysis). Second, it stands to enable a large deposition rate without increasing the conductivity of the bulk electrolyte. While a large concentration of the depositing species is desired for fast plating rates, the concomitant increase in bath conductivity has the adverse effect of reducing the localizing effects of head geometry. By localizing the concentration increase to the fluid between the counter electrode and the reaction zone, the ohmic effects restricting deposition outside of the desired reaction zone will remain, while the increased concentration at the reaction zone will enable fast deposition rates.

Withdrawing the injected electrolyte near the reaction zone has several advantages. First, it reduces the aforementioned pressure drop experienced by the fluid as it passes through the long and narrow head-substrate gap. Second, it reduces the volume holdup within the system and enables electrolyte changes without manually emptying the excess electrolyte from the reservoir. Third, the reduction in volume holdup is accompanied by a reduction in the area of the substrate that is exposed to the electrolyte. Simultaneous injection and withdrawal thus eliminate further the possibility of reactions occurring outside the designated reaction zone.

The present invention can also be used for three-dimensional composition mapping through localized stripping voltammetry. The tool is operated under negative (sucking) flow and an anodic current is passed from one downstream working electrode to the substrate, dissolving the material directly beneath the pixel. The products of the dissolution are sucked up by the negative flow and swept downstream. An additional electrode placed further downstream than the first is then scanned over a potential range as the dissolution-enriched electrolyte passes over its surface. Monitoring the current vs. voltage allows the user to determine which components are present. If this information is already known, the user sets the electrode at a specific voltage and measures the total charge passed as the enriched solution passes by, thus quantifying the amount of that material present in the deposit. Two-dimensional composition maps are obtained by recording the stripping voltammetry signals as a function of x-y position. After one layer is stripped away, the head is lowered and the next layer scanned in the same fashion. Stacking the consecutive two-dimensional composition maps gives composition information in three dimensions.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An electrochemical printer head for use in electrolytically depositing material onto a substrate, the electrochemical printing head comprising:
   a plurality of electrodes, each electrode having a channel therethrough;
   a lead connector attached to the plurality of electrodes, the lead connector having a plurality of electrical leads wherein each electrical lead is electrically connected to at least one electrode, the electrical leads extending accessibly from the printer head for connection to an electric power source; and
   a high electrical resistance means for controlling the distribution of an electrolyte to the electrode channels;
   a resolution-defining layer disposed below the plurality of electrodes, the resolution-defining layer having a plurality of apertures that provides an outflow path for the electrolyte from the electrode channels.

2. The electrochemical printer head of claim 1, wherein the high electrical resistance means includes a plenum that receives electrolyte from a pressurized source of electrolyte.

3. The electrochemical printer head of claim 2, wherein the high electrical resistance means further includes a cross-talk inhibitor made from an electrically insulating material and disposed between the plenum and the plurality of electrodes, wherein the cross-talk inhibitor has a plurality of narrow apertures therethrough that provides a flow path for the electrolyte from the plenum to the electrode channels.

4. The electrochemical printer head of claim 3, wherein the high electrical resistance means further includes a flow distribution layer attached to the plenum, the flow distribution layer having a plurality of inlet apertures to the plenum.

5. The electrochemical printer head of claim 2, further comprising a support layer attached to the plenum, the support layer providing mechanical support for the plurality of electrodes and the lead interconnect layer.

6. The electrochemical printer head of claim 1, wherein the electrodes are large relative to the apertures in the resolution defining layer, and are made from a conductive material that is substantially inert in the electrolyte.

7. The electrochemical printer head of claim 6, wherein the electrodes are made primarily of stainless steel.

8. The electrochemical printer head of claim 1, wherein the electrochemical printer head is made from a plurality of pre-cut layers of material that are assembled and bonded together.

9. An electrochemical printer system comprising:
   a source of pressurized electrolyte;
   a conductive substrate disposed in a container;
   an electrochemical printing head having a plurality of electrodes, each electrode having a channel therethrough, a plurality of electrical leads wherein each electrical lead is electrically connected to at least one electrode, the electrical leads extending accessibly from the printer head for connection to an electric power source, a high electrical resistance means for controlling the distribution of the electrolyte to the electrode channels, and a resolution-defining layer disposed below the plurality of electrodes, the resolution-defining layer having a plurality of apertures that provides an outflow path for the electrolyte from the electrode channels;
   a power source electrically connected to the conductive substrate and selectively connectable to each of the plurality of electrodes such that a circuit is formed between the selected electrodes, the electrolyte, the conductive substrate, and the power source; and
   an actuator for moving the conductive substrate with respect to the electrochemical printing head.

10. The electrochemical printer system of claim 9, wherein the high electrical resistance means for controlling the distribution of the electrolyte to the electrode channels includes a plenum that receives electrolyte from the source of pressurized electrolyte.

11. The electrochemical printer system of claim 10, wherein the high electrical resistance means for controlling the distribution of electrolyte further includes a cross-talk inhibitor made from an electrically insulating material and disposed between the plenum and the plurality of electrodes, wherein the cross-talk inhibitor has a plurality of narrow apertures therethrough that provides a flow path for the electrolyte from the plenum to the electrode channels.

12. The electrochemical printer system of claim 11, wherein the high electrical resistance means for controlling the distribution of electrolyte further includes a flow distribution layer attached to the plenum, the flow distribution layer having a plurality of inlet apertures to the plenum.

13. The electrochemical printer system of claim 10, further comprising a support layer attached to the plenum, the support layer providing mechanical support for the plurality of electrodes and the lead interconnect layer.

14. The electrochemical printer system of claim 9, wherein the electrodes are large relative to the apertures in the resolution defining layer, and are made from a conductive material that is substantially inert in the electrolyte.

15. The electrochemical printer system of claim 14, wherein the electrodes are made primarily of stainless steel.

16. The electrochemical printer system of claim 9, wherein the electrochemical printer head is made from a plurality of precut layers of material that are assembled and bonded together.

17. A method for producing a functionally-graded material deposit comprising:
   providing a conductive substrate in a container containing a liquid electrolyte;
   providing an electrochemical printer head having a plurality of electrodes with a channel therethrough for each electrode, the electrochemical printer head having a surface positioned in close proximity to the conductive substrate, wherein the electrochemical printer includes a plurality of flow paths therethrough, at least some of the flow paths including at least one of the electrode channels;
   providing electrolyte under pressure to the electrochemical printer head such that electrolyte flows through at least some of the plurality of flow paths and is expelled toward the conductive substrate through a resolution-defining layer disposed below the plurality of electrodes;
   selectively applying an electric potential between the conductive substrate and at least one of the plurality of electrodes such that a circuit is formed between the electrode, the electrolyte, and the conductive substrate; and
   varying the flow rate of the electrolyte through the electrochemical printer head and a parameter of the applied electric potential to produce a functionally graded material deposit.

18. The method of claim 17, further comprising the step of moving the conductive substrate with respect to the printer head to produce a desired shape of functionally-graded material deposit.

19. The method of claim 17, further comprising the step of repeatedly moving the printer head over the conductive substrate while varying the flow rate, and a parameter of the electric potential to build up a three-dimensional functionally graded material deposit.

20. The method of claim 19, further comprising the step of varying the distance between the electrochemical printer head and the conductive substrate to accommodate the functionally graded material deposit.

21. The method of claim 17, wherein the electrochemical printer head further comprises a plenum fluidly connected to the source of pressurized electrolyte and a cross-talk inhibition layer made from an electrically insulating material and disposed between the plenum and the plurality of electrodes, wherein the cross-talk inhibition layer has a plurality of flow channels therethrough.

22. The method of claim 17, further comprising the step of dissolving away a sacrificial portion of the functionally graded material deposit.

* * * * *